United States Patent [19]
Fischer et al.

[11] Patent Number: 6,147,365
[45] Date of Patent: Nov. 14, 2000

[54] OPTOELECTRONIC SEMICONDUCTOR COMPONENT

[75] Inventors: Frank Fischer; Thomas Litz, both of Würzburg; Hans-Jürgen Lugauer, Gerbrunn; Markus Keim, Würzburg; Thierry Baron, Gerbrunn; Günter Reuscher; Gottfried Landwehr, both of Würzburg, all of Germany

[73] Assignee: Infineon Technologies AG, Munich, Germany

[21] Appl. No.: 09/364,898

[22] Filed: Aug. 2, 1999

Related U.S. Application Data

[63] Continuation of application No. PCT/DE98/00263, Jan. 29, 1998.

[30] Foreign Application Priority Data

Jan. 31, 1997 [DE] Germany ............... 197 03 615

[51] Int. Cl.⁷ .................... H01L 29/22; H01L 31/0256
[52] U.S. Cl. ............................................. 257/78; 257/103
[58] Field of Search ...................... 257/78, 103

[56] References Cited

U.S. PATENT DOCUMENTS

| | | |
|---|---|---|
| 5,010,374 | 4/1991 | Cooke et al. . |
| 5,268,918 | 12/1993 | Akimoto et al. . |
| 5,291,506 | 3/1994 | Ahn . |
| 5,338,944 | 8/1994 | Edmond et al. . |
| 5,363,395 | 11/1994 | Gaines et al. . |
| 5,481,558 | 1/1996 | Ikeda et al. . |
| 5,574,296 | 11/1996 | Park et al. . |

FOREIGN PATENT DOCUMENTS

| | | |
|---|---|---|
| 0 709 939 A1 | 5/1996 | European Pat. Off. . |
| 7-66494 | 3/1995 | Japan . |

OTHER PUBLICATIONS

Akira Ishibashi: "II–VI Blue–Green Laser Diodes", IEEE Journal of selected Topics in Quantum Electronics, Jun. 1, 1995, No. 2, New York, US, pp. 741–748.

A. Waag et al.: "Laser diodes based on beryllium–chalcogenides", Appl. Phys. Lett. 70 (3), Jan. 20, 1997, pp. 280–282.

F. Fischer et al.: "Halbleiterlaser bringen Farbe ins Spiel— Semiconductor lasers bring color into play", Laser und Optoelektronik 28(5)/1996, pp. 67–73.

Shuji Nakamura: "InGaN/ALGaN blue–light–emitting diodes", J. Vac. Sci. Technol. A 13(3), My/Jun. 1995, pp. 705–710.

W. Buldau: "Halbleiter–Optoelektronik", semiconductor optoelectronics, hanser Verlag 1995, chapter 12—Advanced Laser Concepts, pp. 182–187.

*Primary Examiner*—John Guay
*Attorney, Agent, or Firm*—Herbert L. Lerner; Laurence A. Greenberg; Werner H. Stemer

[57] ABSTRACT

An optoelectronic semiconductor component has a radiation-emitting active layer sequence which is associated with at least one poorly dopable semiconductor layer of a first conductivity type. A heavily doped first degenerated junction layer of a first conductivity type and a heavily doped second degenerated junction layer of a second conductivity type opposite to the first conductivity type are provided between the poorly dopable semiconductor layer and a contact layer of the semiconductor body, the contact layer being associated with the poorly dopable semiconductor layer.

16 Claims, 3 Drawing Sheets

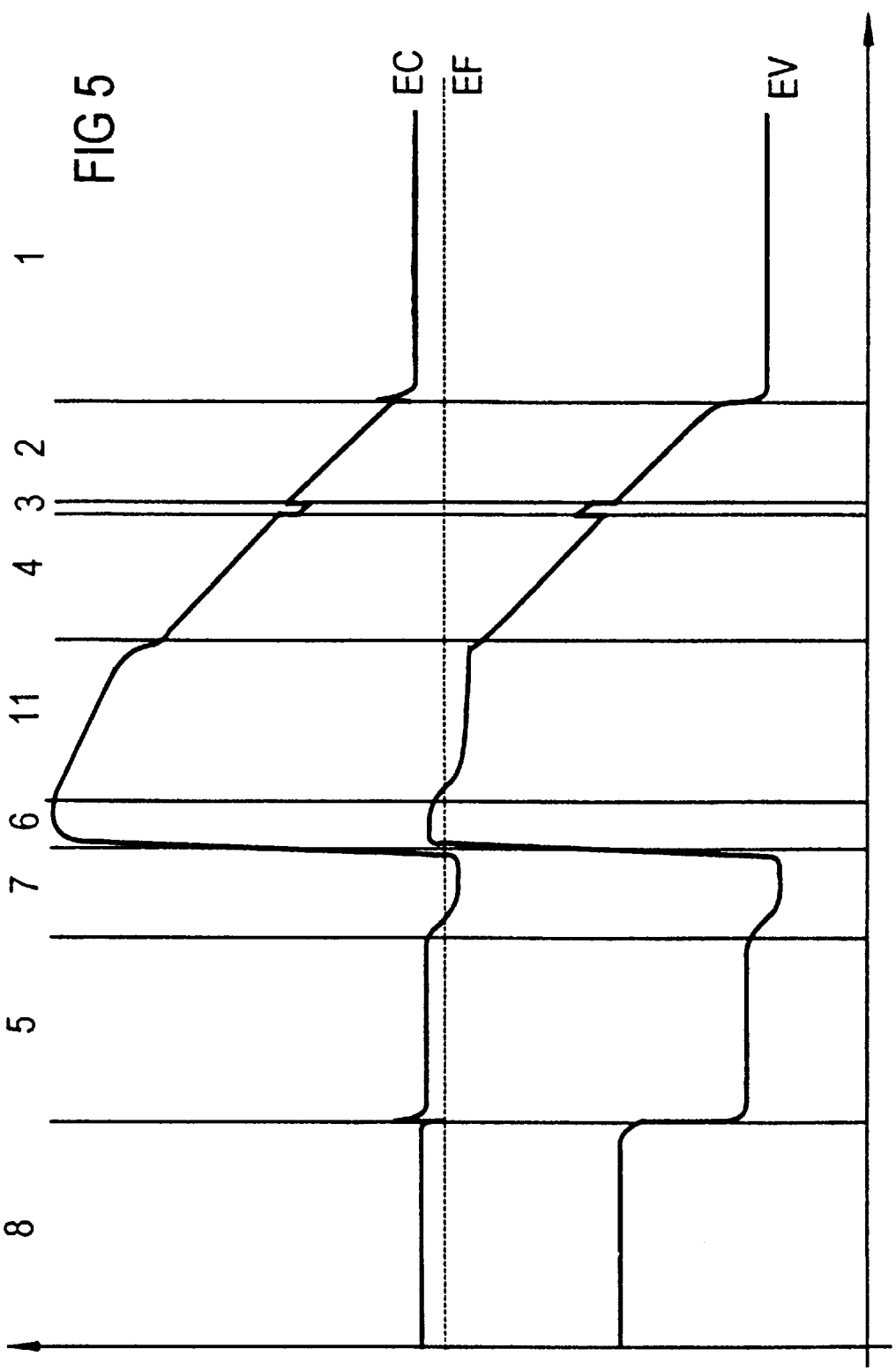

OPTOELECTRONIC SEMICONDUCTOR COMPONENT

CROSS-REFERENCE TO RELATED APPLICATION

This application is a continuation of copending International Application PCT/DE98/00263, filed Jan. 29, 1998, which designated the United States.

BACKGROUND OF THE INVENTION

Field of the Invention

The invention relates to an optoelectronic semiconductor component having a semiconductor body which is suitable for generating electromagnetic radiation. The semiconductor body has an active layer sequence which is disposed on a semiconductor substrate, in particular an n-conducting semiconductor substrate. The electromagnetic radiation is generated in the active layer sequence when a current flows through the semiconductor body. The active layer sequence is associated with at least one poorly dopable semiconductor layer of a first conductivity type, in particular a p-doped II–VI semiconductor layer including ZnSe, a p-doped III–V semiconductor layer including GaN, or an n-doped II–VI semiconductor layer including CdTe.

An optoelectronic semiconductor component of this type is disclosed for example in U.S. Pat. No. 5,268,918, which describes a semiconductor body of a semiconductor laser component, in which an n-conducting or p-conducting first cladding layer, composed of ZnMgSSe or BeZnSTe, is deposited on a semiconductor substrate, composed of n-conducting or p-conducting GaAs or GaP. On the first cladding layer is disposed, in turn, an active layer, composed of ZnSSe or ZnCdSe. A p-conducting or n-conducting second cladding layer, composed of ZnMgSSe or BeZnSTe is provided on the active layer. The optoelectronic component disclosed in U.S. Pat. No. 5,268,918 is based on the principle of the so-called "Separate Confinement Heterostructure" (SCH). In the case of this layer structure, the electrical charge carriers and the light waves generated are guided independently of one another. Electrons and holes are injected into the light-emitting active zone which is configured as a single or multiple quantum well structure (Single Quantum Well, SQW, or Multiple Quantum Well, MQW) and thus has a smaller band gap than barrier layers adjoining the active zone. The barrier layers (waveguide layers) have a smaller refractive index than the active zone and, at the same time, a larger refractive index than the cladding layers adjoining the barrier layers. As result of this difference in refractive index, the light wave generated is restricted to the narrow region around the active zone. By oppositely doping the two cladding layers, a pn junction is produced into which charge carriers are injected when a suitable voltage is applied.

Similar optoelectronic semiconductor components are described for example in the article "II–VI Blue-Green Laser Diodes", by A. Ishibashi, IEEE Journal of Selected Topics in Quantum Electronics, 1, pp. 741 to 748, (1995) and in JP 07-066494.

The fundamental structures of SQW and MQW semiconductor lasers and of the SCH construction are described for example in the book "Halbleiter-Optoelektronik" [Semiconductor Optoelectronics], by W. Buldau, Hanser Publishers, Munich, Vienna, 1995, pp. 182–187, and are therefore not explained in any specific detail at this point.

A problem that frequently arises in semiconductor technology is that certain semiconductor materials are poorly p- or n-dopable. Poorly dopable are in particular II–IV semiconductor materials having ZnSe, (poorly p-dopable; in particular ZnMgSSe or BeMgZnSe) or CdTe (poorly n-dopable), or III–V semiconductor materials having GaN (poorly p-dopable). U.S. Pat. No. 5,338,944 describes for instance a blue light emitting SiC diode in which the problem of poor transparency of p-doped SiC is solved through the use of a degenerated pn junction on a thin p-doped SiC layer.

Particularly in the case of SQW and MQW semiconductor lasers with an SCH construction based on II–VI semiconductor material, in which a p-conducting covering layer (waveguide layer or cladding layer) made of ZnSe-based semiconductor material, in particular ZnMgSSe or BeMgZnSe, is used, this problem impairs the functional properties of the laser to a high degree.

The band gap and also the refractive index of the above-mentioned materials can be set by varying the Mg concentration and the S concentration or the Be and Mg concentrations. With increasing proportions of magnesium and sulfur or beryllium and magnesium, however, the efficiency of the plasma-activated nitrogen which is used as an acceptor for p-type conductivity in the above-mentioned compositions decreases. As a result, layers having relatively high Mg and S concentrations or relatively high Be and Mg concentrations always have a high electrical resistance. Moreover, the resistances of the electrical contacts to these layers are thus increased, as a result of which the properties of the laser component are impaired even further. In conventional II–VI semiconductor lasers, these problems mean that only covering layers with a maximum band gap of approximately 2.95 eV (300 K) are used.

As a consequence of this restriction, the height of the energy barrier between the semiconductor material of the quantum well structure (SQW or MQW) and the cladding layers is considerably limited, as a result of which electrical charge carriers are contained only insufficiently in the quantum well.

However, creating relatively high barriers is important in order to obtain emission wavelengths of less than approximately 500 nm, and so far it has been difficult to achieve high barriers in ZnMgSSe—SCH semiconductor lasers. Furthermore, with low Mg and S concentrations in the cladding layers, the change in the refractive index between the waveguide layers and the cladding layers is relatively small, with the result that a light wave generated in the active zone is guided only weakly.

A further problem arising with known II–VI semiconductor layers is that of forming an ohmic contact to p-conducting layers. In order to improve this ohmic contact on the p-conducting side of the semiconductor laser, a superlattice including ZnSe and ZnTe has generally been used to date. The structural quality of this superlattice is however very poor on account of the considerable lattice mismatch between ZnSe and ZnTe. In addition, BeZnTeSe grading or BeTe/ZnSe pseudograding have also been proposed as p-type contact. In the case of these contact layers, it is technologically difficult to prevent oxidation of the hygroscopic material BeTe at the semiconductor surface. If a BeZnTeSe grading or a BeTe/ZnSe pseudograding is used as an electrically active buffer layer between the p-conducting cladding layer and the semiconductor substrate, p-conducting GaAs is used as the semiconductor substrate since the valence band discontinuity between BeTe and GaAs is small. What is disadvantageous here is that p-conducting GaAs is commercially available only with a quality that is lower than that of n-conducting GaAs. As as a result, the structural properties of the applied epitaxial layers are considerably reduced.

SUMMARY OF THE INVENTION

It is accordingly an object of the invention to provide an improved optoelectronic component which overcomes the above-mentioned disadvantages of the heretofore-known optoelectronic components of this general type and which has an improved functionality and operatability compared to the known optoelectronic semiconductor components described above. It is in particular an object to provide an improved semiconductor laser component for the spectral range of between 680 nm and 300 nm.

With the foregoing and other objects in view there is provided, in accordance with the invention, an optoelectronic semiconductor component, comprising:

a semiconductor substrate;

a contact layer, for example a metallization layer, connected to the semiconductor substrate;

an active zone provided on the semiconductor substrate for generating an electromagnetic radiation in the active zone when a current flows through the active zone;

a poorly dopable semiconductor layer associated with the active zone; and a reverse-biased layer sequence having a heavily p-doped first degenerated junction layer containing BeTe and having a heavily n-doped second degenerated junction layer, the reverse-biased layer sequence serving as an electrical charge carrier source and being disposed between the poorly dopable semiconductor layer and the contact layer, and the heavily p-doped first degenerated junction layer disposed between the poorly dopable semiconductor layer and the heavily n-doped second degenerated junction layer.

In accordance with another feature of the invention, the poorly dopable semiconductor layer is a p-doped II–VI semiconductor layer containing ZnSe.

In accordance with yet another feature of the invention, the p-doped II–VI semiconductor layer includes a ZnMgSSe-containing II–VI semiconductor layer and/or a BeMgZnSe containing II–VI semiconductor layer.

In accordance with yet a further feature of the invention, the heavily p-doped first degenerated junction layer contains BeMgZnTe and/or BeZnCdTe.

In accordance with an added feature of the invention, a first waveguide layer and a second waveguide layer are provided, preferably in an ZnSe-based semiconductor laser, and the active zone has a quantum well structure (SQW or MQW in particular with an SCH structure) disposed between the first waveguide layer and the second waveguide layer.

In accordance with an additional feature of the invention, a first outer cladding layer and a second outer cladding layer are provided, the active zone and the first and second waveguide layers are provided between the first outer cladding layer and the second outer cladding layer.

In accordance with another feature of the invention, the second outer cladding layer is n-conducting, the first outer cladding layer includes the poorly dopable semiconductor layer, the first degenerated junction layer and the second degenerated junction layer are disposed between the second outer cladding layer and the contact layer is assigned to the second outer cladding layer.

In accordance with another feature of the invention, the first outer cladding layer and the second outer cladding layer are n-conducting, the poorly dopable semiconductor layer, the first degenerated junction layer, and the second degenerated junction layer are disposed between one of the first and second waveguide layers and one of the first and second outer cladding layers provided downstream of one of the waveguide layers as seen from the active zone.

In accordance with a further feature of the invention, the first outer cladding layer and the second outer cladding layer are n-conducting, the first degenerated junction layer is provided on one of the first and second waveguide layers and the second degenerated junction layer is provided on the first degenerated junction layer, one of the first and second outer cladding layers is provided downstream of the second degenerated junction layer, as seen from the active zone.

In accordance with yet another feature of the invention, the active zone includes semiconductor material selected from the group consisting of beryllium-containing chalcogenides and $Zn_{1-x}Cd_xS_ySe_{1-y}$.

In accordance with an additional feature of the invention, the first waveguide layer and the second waveguide layer include semiconductor material selected from the group of beryllium-containing chalcogenides.

In accordance with another feature of the invention, the first outer cladding layer and the second outer cladding layer include semiconductor material selected from the group of beryllium-containing chalcogenides.

In accordance with yet another feature of the invention, the first degenerated junction layer is doped with a dopant selected from the group consisting of As, Sb, P, K, Rb, Cs, C, Si, Ge, and Sn.

In accordance with a further feature of the invention, the first and the second outer cladding layers each have a thickness of at least 200 nm and are spaced apart by a distance between approximately 100 nm and approximately 400 nm.

In an alternative embodiment, the second outer cladding layer preferably includes the poorly dopable semiconductor layer (p-doped II–VI semiconductor layer having ZnSe). The first heavily doped degenerated junction layer ($p^+$-conducting junction layer) and the second heavily doped degenerated junction layer ($n^+$-conducting junction layer) are preferably provided between the second outer cladding layer and the contact layer of the semiconductor body, the contact layer being assigned to the cladding layer.

This $p^+n^+$ layer sequence serves for example as electrical contact between a p-conducting cladding layer and an n-conducting semiconductor substrate or between a p-conducting cladding layer and a contact layer of the semiconductor body. By virtue of the $p^+n^+$ layer sequence being reverse-biased relative to the component, charge carriers are accelerated within an electric field in the $p^+n^+$ layer sequence and injected rapidly into the active zone. In the $p^+n^+$ layer sequence, a genuine inversion of the conductivity type occurs at the distance of a Debye length around the junction. That is to say the Fermi level is moved into the conduction band as a result of n-type doping on one side of the diode and, on the opposite side, holes pull the Fermi level into the valence band as a result of p-type doping ("degeneration"). As a result of the very narrow space charge zone (depletion layer) of a few Ångströms between these degenerately doped zones of the $p^+n^+$ diode, interband tunneling of electrons from the valence band of the p-doped semiconductor into states of the conduction band of the n-doped semiconductor may occur under reverse biasing, as a result of which holes are produced in the p-doped zone.

In a further preferred embodiment of a quantum well SCH semiconductor laser according to the invention, the first outer cladding layer and the second outer cladding layer are n-doped, and the poorly dopable semiconductor layer, for example a p-doped II–VI semiconductor layer having ZnSe, the first heavily doped degenerated junction layer, for example a $p^+$-conducting junction layer, and the second heavily doped degenerated junction layer, for example an n-conducting junction layer, are provided between one of the two waveguide layers and the cladding layer which is provided downstream thereof, as seen from the active zone. In this case, the $p^+n^+$ layer sequence acts as a "hole converter" or "injector" near the active layer sequence.

In the components according to the invention, in particular in the embodiment mentioned last, electrons are used for charge transport and are not converted into holes until shortly before the active zone. This region can be manufactured well with BeTe, in particular with BeMgZnTe or BeZnCdTe, since BeTe can be doped heavily in a p-conducting fashion in a simple manner and has good lattice matching.

A particularly preferred embodiment of the optoelectronic component according to the invention is an SCH quantum well laser in which the active zone, the covering layers (waveguide layers and outer cladding layers) and the junction layers have semiconductor materials from the group of beryllium-containing chalcogenides. Examples of particularly preferred materials are $Be_xZn_yCd_{1-x-y}Se$ ($0 \leq x \leq 1$, $x+y \leq 1$) for the active zone, $Be_xMg_yZn_{1-x-y}Se$ ($0 \leq x \leq 1$, $0 \leq y \leq 1$, $x+y \leq 1$) or $Zn_{1-x}Mg_xS_ySe_{1-y}$ ($0 \leq x \leq 1$, $0 \leq y \leq 1$) for the covering layers, heavily doped, p-conducting $Be_xMg_yZn_{1-x-y}Te$ ($0 \leq x \leq 1$, $x+y \leq 1$) for the $p^+$-conducting junction layer, and heavily doped, n-conducting $In_xGa_{1-x}As$ or heavily doped, n-conducting $Be_xMg_yZn_{1-x-y}Se$ ($0 \leq x1$, $0 \leq y \leq 1$, $x+y \leq 1$) for the $n^+$-conducting junction layer. A matching layer which has a BeZnTeSe grading or a BeTe/ZnSe pseudograding is preferably provided between the $p^+$-conducting junction layer and the waveguide layer which is next to the latter. In this embodiment, it is preferable to use an n-conducting GaAs semiconductor substrate which is readily available with good quality, and a conventional n-type front side contact that can be produced in a particularly simple manner.

A grading is a layer structure in which the proportions of the constituents, the Be and Te concentrations in this example, are varied in one spatial direction in order to obtain a gradual matching, for example of the conduction band energy.

In the case of a pseudograding, this variation is achieved through the use of a changing layer thickness ratio of thin layers which succeed one another alternately and have different compositions. In this case, the layer thicknesses must be chosen to be thin enough to ensure an efficient charge carrier transport.

Another particularly preferred embodiment of the optoelectronic component according to the invention is likewise an SCH quantum well laser in which the active zone, covering layers (waveguide layers and outer cladding layers) and the junction layers have semiconductor materials from the group of beryllium-containing chalcogenides. As particularly preferred materials for the individual layers, reference is made to those materials described in connection with the SCH quantum well laser according to the invention that was described last. In contrast to the above-mentioned structure, however, in this case the $p^+$-conducting junction layer and the $n^+$-conducting junction layer are provided between a waveguide layer and a cladding layer and the first and second cladding layers have the same conductivity type. In addition, a matching layer, for example in the form of a BeZnTeSe grading or a BeTe/ZnSe pseudograding, may advantageously be provided between the $p^+$-conducting junction layer and the above-mentioned waveguide layer. This additional matching layer enables charge carriers to be transported into the quantum well. It forms a barrier for charge carriers of a first type and, at the same time, enables the complementary charge carrier type to pass. In this embodiment, too, it is preferable to use an n-conducting GaAs semiconductor substrate which is readily available with good quality and a conventional n-type front side contact that can be produced in a particularly simple manner.

The structure according to the invention makes it possible to attain high concentrations of Be and Mg in BeMgZnSe and also Mg and S in ZnMgSSe in the cladding layers, since experience shows that the n-type doping of these materials is more efficient than the p-type doping. In this way, it is possible to achieve band gaps in the cladding layers of more than 3.1 eV (300 K). These high concentrations enable the inclusion of electrical charge carriers to be improved and the optical wave to be guided better. Furthermore, high-impedance regions introduced by p-doped BeMgZnSe or ZnMgSSe need not be provided.

A further advantage is afforded when $Be_xMg_yZn_{1-x-y}Te$ is used in components which emit shortwave light with wavelengths of less than 460 nm. For this wavelength, $Be_xMg_yZn_{1-x-y}Te$ has a smaller refractive index than, for example, $Be_xZn_yCd_{1-x-y}Se$ as a result of which the optical wave is guided even better with the use of $Be_xMg_yZn_{1-x-y}Te$ in the $p^+$-conducting junction layer and in the matching layer.

Aside from plasma-activated nitrogen, which may be used as p-type dopant for BeTe and thus also for BeMgZnTe and BeZnCdTe, it is also advantageously possible to use As as a p-type dopant. As has a considerably lower degree of diffusion than nitrogen, which leads to increased stability for the doping. Likewise, it is also possible to use one or more dopants from the group Sb, P, group I elements such as K, Rb, and Cs and group IV elements such as C, Si, Ge, and Sn as the dopant.

Other features which are considered as characteristic for the invention are set forth in the appended claims.

Although the invention is illustrated and described herein as embodied in an optoelectronic semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is an energy band diagram for the exemplary embodiment of FIG. 3.

DESCRIPTION OF THE PREFERRED EMBODIMENTS

Figure 1:
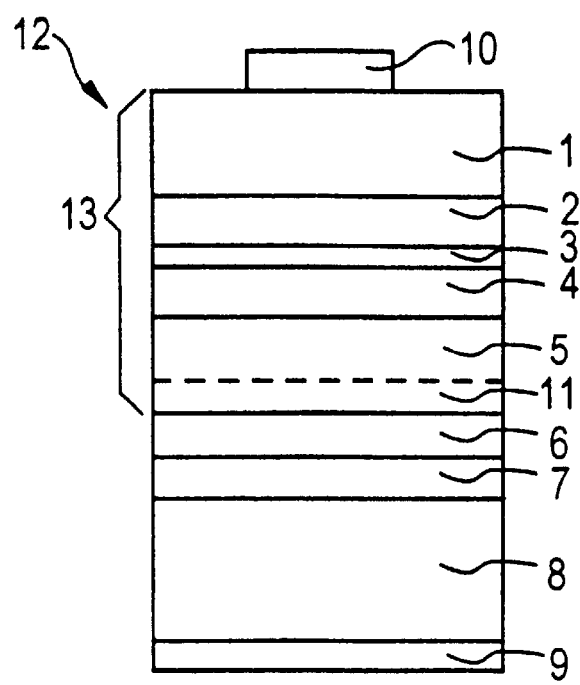
FIG. 1 is a diagrammatic, cross-sectional view of a layer structure of a first exemplary embodiment of the invention.

Referring now to the figures of the drawings in detail and first, particularly, to FIG. 1 thereof, there is shown a layer structure of a semiconductor body 12 of an SCH quantum well semiconductor laser. A sequence of two oppositely conductive, heavily doped, degenerated junction layers 6, 7 is applied on a semiconductor substrate 8 of a first conductivity type which is, for example, composed of n-conducting GaAs. For example, on the n-conducting semiconductor substrate 8 there is applied an n$^+$-conducting junction layer 7 and, on top of the latter, a p$^+$-conducing junction layer 6. This sequence of junction layers 6, 7 serves as a buffer between an SCH quantum well structure 13 provided above the junction layers 6, 7. This quantum well structure is formed for example from covering layers, such as a first outer cladding layer 5 and a second outer cladding layer 1 and a first waveguide layer 4 and a second waveguide layer 2, and an active zone 3.

In this case, the semiconductor substrate 8 and the junction layer 7 are of a first conductivity type (for example hole or electron conductivity) and the junction layer 6 and the first cladding layer 5 are of a second conductivity type opposite to the first conductivity type. The conductivity type of the second cladding layer 1 is likewise opposite to that of the first cladding layer 5.

The junction layer 7 is composed for example of heavily doped, n-conducting $In_xGa_{1-x}As$ or of heavily doped, n-conducting $Be_xMg_yZn_{1-x-y}Se$ ($0 \leq x \leq 1, 0 \leq y \leq 1, x+y \leq 1$), and the junction layer 6 is composed for example of heavily doped, p-conducting $Be_xMg_yZn_{1-x-y}Te$ ($0 \leq x \leq 1, x+y \leq 1$).

The SCH quantum well structure 13 has, for example, a $Be_xZn_yCd_{1-x-y}Se$ quantum well ($0 \leq x \leq 1, x+y \leq 1$) as the active zone 3, $Be_xMg_yZn_{1-x-y}Se$ layers ($0 \leq x \leq 1, 0 \leq y \leq 1, x+y \leq 1$) as the waveguide layers 4, 2 and $Be_xMg_yZn_{1-x-y}Se$ layers ($0 \leq x \leq 1, 0 \leq y \leq 1, x+y \leq 1$) as the cladding layers 1, 5, the first cladding layer 5 being composed for example of a matching layer 11, composed of a BeZnTeSe grading or a BeTe/ZnSe pseudograding, and a p-doped $Be_xMg_yZn_{1-x-y}Se$ layer ($0 \leq x \leq 1, 0 \leq y \leq 1, x+y \leq 1$). However, the matching layer 11 may also be omitted, so that the first outer cladding layer 5 is applied directly on the second junction layer 6. The second cladding layer 1 may have for example n-conducting $Be_xMg_yZn_{1-x-y}Se$ ($0 \leq x \leq 1, 0 \leq y \leq 1, x+y \leq 1$).

The electrical connection of the semiconductor body 12 is formed by an ohmic rear side contact 9 and an ohmic front side contact 10, the ohmic rear side contact 9 being provided on the underside of the semiconductor substrate 8 and the ohmic front side contact 10 being provided on the second outer cladding layer 1. In the case of an n-conducting GaAs substrate 8, conventional n-type top side contacts that can be produced in a simple manner may be used. The second ohmic contact 10 may be composed for example of a sequence of Ti/Pt/Au or of aluminum.

Figure 2:
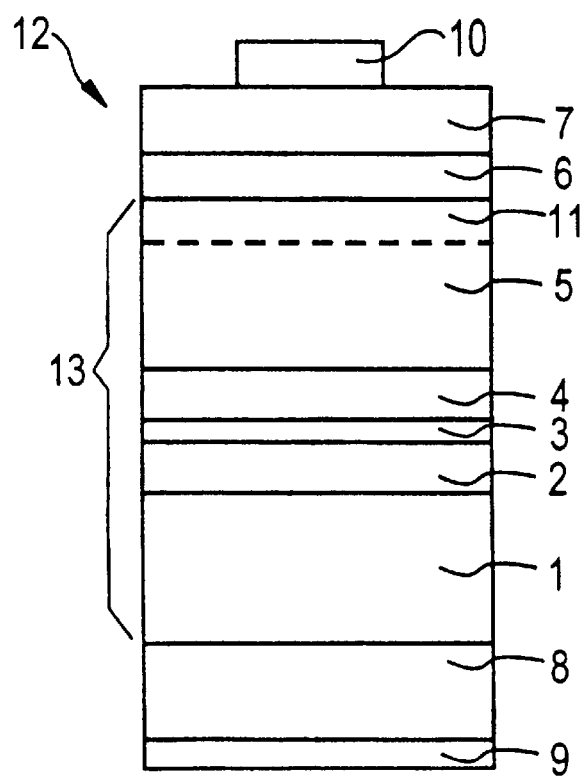
FIG. 2 is a diagrammatic, cross-sectional view of a layer structure of a second exemplary embodiment of the invention.

In the exemplary embodiment in accordance with FIG. 2, in contrast to the above-described exemplary embodiment in accordance with FIG. 1, the sequence of heavily doped degenerated junction layers 6 and 7 is provided between the front side contact 10 and the SCH quantum well structure 13. Accordingly, the front side contact 10 is no longer applied on the second cladding layer 1 but rather on the junction layer 7 or on a further layer provided above the latter. The SCH quantum well structure 13 and the sequence of heavily doped degenerated junction layers 6, 7 are applied on the semiconductor substrate 8 altogether in an order opposite to that in the case of the exemplary embodiment in accordance with FIG. 1. The individual layers are composed for example of the same materials as the corresponding layers of the exemplary embodiment in accordance with FIG. 1.

Accordingly, the semiconductor substrate is once again composed for example of n-conducting GaAs, on which there is disposed an SCH quantum well structure 13 having for example a $Be_xZn_yCd_{1-x-y}Se$ quantum well ($0 \leq x \leq 1, x+y \leq 1$) as the active zone 3, $Be_xMg_yZn_{1-x-y}Se$ layers ($0 \leq x \leq 1, 0 \leq y \leq 1, x+y \leq 1$) as the waveguide layers 4, 2 and $Be_xMg_yZn_{1-x-y}Se$ layers ($0 \leq x \leq 1, 0 \leq y \leq 1, x+y \leq 1$) as the cladding layers 1, 5, the first cladding layer 5 being composed for example of a matching layer, composed of a BeZnTeSe grading or a BeTe/ZnSe pseudograding and a p-doped $Be_xMg_yZn_{1-x-y}Se$ layer ($0 \leq x \leq 1, 0 \leq y \leq 1, x+y \leq 1$). However, the matching layer 11 may be omitted in this case as well, so that the first outer cladding layer 5 directly adjoins the second junction layer 6.

By way of example, a heavily doped, p-conducting junction layer 6, composed of $Be_xMg_yZn_{1-x-y}Te$ ($0 \leq x \leq 1, x+y \leq 1$), is provided on that side of the SCH quantum well structure 13 which is opposite to the GaAs substrate 8, on which junction layer there is provided, a heavily doped, n-conducting junction layer 7, for example composed of $Be_xMg_yZn_{1-x-y}Se$ ($0 \leq x \leq 1, 0 \leq y \leq 1, x+y \leq 1$). The use of this heavily doped n-conducting junction layer 7 advantageously prevents BeTe from coming into direct contact with air, as a result of which, major technological advantages can be obtained and low-impedance contacts can be produced. The front side contact 10 may be composed for example of a sequence of Ti/Pt/Au or aluminum.

Figure 3:
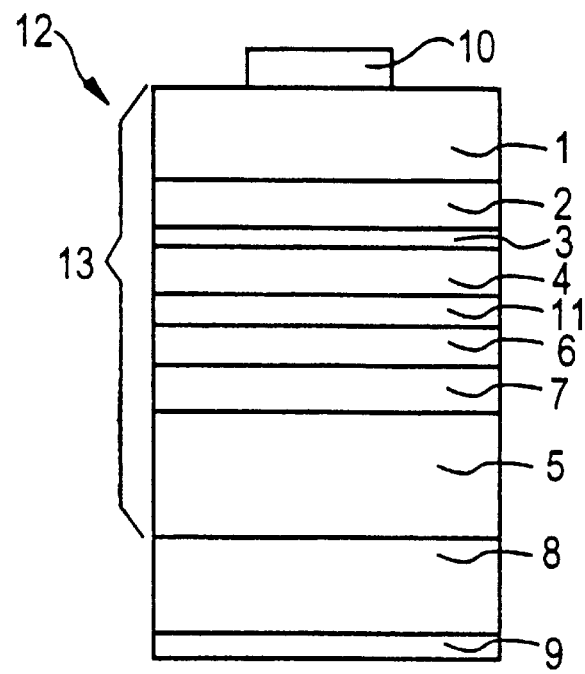
FIG. 3 is a diagrammatic, cross-sectional view a layer structure of a third exemplary embodiment of the invention.

In the exemplary embodiment in accordance with FIG. 3, the sequence of heavily doped degenerated junction layers 6 and 7 is provided between the first outer cladding layer 5 and the first waveguide layer 4. In this exemplary embodiment, the order of the individual layers, starting at the semiconductor substrates of a first conductivity type, is as follows:

first outer cladding layer 5 of the first conductivity type, first degenerated junction layer 7 of the first conductivity type, second degenerated junction layer 6 of the second conductivity type, first waveguide layer 4, active zone 3, second waveguide layer 2, second outer cladding layer 1 of the first conductivity type, and front side contact 10.

The individual layers are composed for example of the same materials as the corresponding layers of the exemplary embodiment in accordance with FIG. 1.

Furthermore, it may be necessary to insert a matching layer 11 between the heavily doped second degenerated junction layer 6 and the first waveguide layer 4, which matching layer enables charge carriers to be transported into the quantum well 3. In this case, care should be taken to ensure that this layer forms a barrier for charge carriers of one type. At the same time, transport for the complementary charge carrier type is enabled.

The refractive indices of the first degenerated junction layer 7, of the second degenerated junction layer 6 and of the matching layer 11 are advantageously matched to the waveguide function. In particular, care should be taken to ensure that the refractive indices of the outer cladding layers 1 and 5 are lower than in the remaining layers (second waveguide layer 2, active zone 3, first waveguide layer 4, second degenerated junction layer 6, first degenerated junction layer 7, matching layer 11). In this embodiment, the layers 1, 2, 5, 7, 8 are once again of the same conductivity type. The opposite conductivity type to the latter is predominant in the layers 4, 6, 11.

In a special embodiment of this exemplary embodiment, the semiconductor substrate 8 is an n-conducting GaAs substrate on which an n-conducting $Be_xMg_yZn_{1-x-y}Se$ layer ($0 \leq x \leq 1$, $0 \leq y \leq 1$, $x+y \leq 1$) is applied as the first outer cladding layer 5.

The junction layer 7 is, for example, a highly n-conducting $Be_xMg_yZn_{1-x-y}Se$ layer ($0 \leq x \leq 1$, $0 \leq y \leq 1$, $x+y \leq 1$) and the junction layer 6 is, for example, a highly p-conducting $Be_xMg_yZn_{1-x-y}Te$ layer ($0 \leq x \leq 1$, $x+y \leq 1$), which is electrically connected to the waveguide layer 4 through the use of a p-conducting BeZnTeSe grading or through the use of a BeTe/ZnSe pseudograding as the matching layer 11. The active zone 3 has a quantum well made for example of $Be_xZn_yCd_{1-x-y}Se$ ($0 \leq x \leq 1$, $0 \leq y \leq 1$, $x+y \leq 1$). The waveguide layers 2, 4 may be composed of $Be_xMg_yZn_{1-x-y}Se$ ($0 \leq x \leq 1$, $0 \leq y \leq 1$, $x+y \leq 1$). The second outer cladding layer 1 is for example composed of n-conducting $Be_xMg_yZn_{1-x-y}Se$ ($0 \leq x \leq 1$, $0 \leq y \leq 1$, $x+y \leq 1$) and the contact 10 is composed for example of a sequence of Ti/Pt/Au or of aluminum.

The sum of the layer thicknesses of the layers 2, 3, 4, 6, 7, 11, that is to say of the layers which act as waveguides, should advantageously not fall below 100 nm and not exceed 400 nm, whereas the cladding layers 1 and 5 should have a thickness of at least 200 nm. This structure makes it possible to obtain high concentrations of Be and Mg in BeMgZnSe or Mg and S in ZnMgSSe in the covering layers 1 and 5, since experience shows that the n-type doping of these materials is more efficient that the p-doping. In this way, it is possible to achieve band gaps in the covering layers of more than 3.1 eV (300 K). These high concentrations make it possible to improve the containment of the electrical charge carriers and to improve the guiding of the optical wave. Furthermore, high-impedance regions made of p-doped BeMgZnSe or ZnMgSSe are not provided. A further advantage is afforded when $Be_xMg_yZn_{1-x-y}Te$ is used in components which emit short-wave light with wavelengths of less than 460 nm. For this wavelength, $Be_xMg_yZn_{1-x-y}Te$ has a smaller refractive index than $Be_xZn_yCd_{1-x-y}Se$, for example, as a result of which the optical wave is guided even better with the use of $Be_xMg_yZn_{1-x-y}Te$ in layers 6 and 11.

Figure 4:
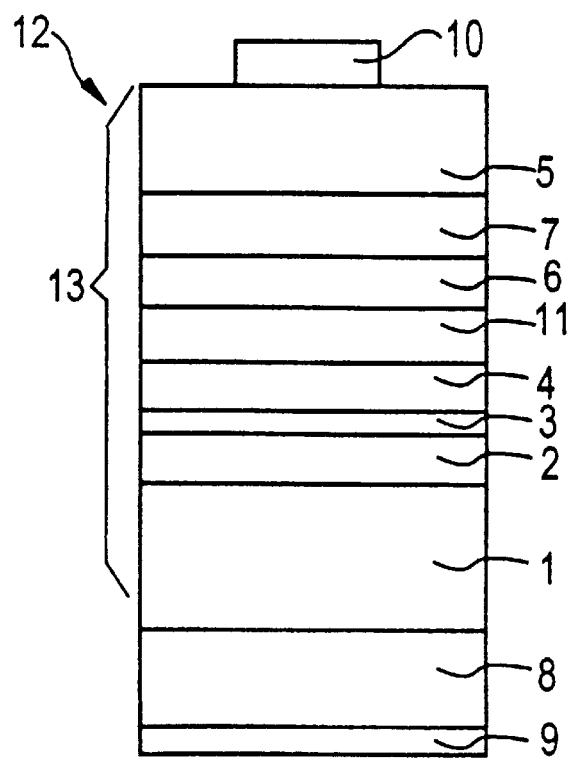
FIG. 4 is a diagrammatic, cross-sectional view of a layer structure of a fourth exemplary embodiment of the invention.

The energy band diagram of the exemplary embodiment of the component according to the invention in accordance with FIG. 3 is illustrated schematically in FIG. 5. The individual regions are designated analogously to the layer sequence of FIG. 3. The charge carrier injection in this layer structure takes place in the following manner: by applying an electric voltage which forward-biases the pn junction, whose p-type side comprises the layers 6, 11 and 4 and whose n-type side comprises the layers 2 and 1, electrons are brought from the contact 10 (not illustrated in FIG. 5) via the cladding layer 1 and the waveguide layer 2 into the active zone 3. With an energy barrier, the matching layer 11 in this case prevents negative charge carriers from being able to migrate into the heavily p-doped junction layer 6 (this function may alternatively be performed by layer 4 as well). In this example, by the application of the external voltage, electrons are extracted from the substrate side of the SCH quantum well structure 13 via the heavily n-doped junction layer 7, the n-conducting outer cladding layer 5 and the n-type GaAs substrate 8. At the junction between the heavily n-doped junction layer 7 and the heavily p-doped junction layer 6, electrons from the valence band can penetrate, from the material of the p-doped junction layer 6, the barrier to the conduction band to the junction layer 7. Thus an effective hole current via the layers 6, 11 and 4 into the active zone 3 is generated. In this case, the waveguide layer 2 and/or the outer cladding layer 1 form an energy barrier for holes. =p In the exemplary embodiment of FIG. 4, in contrast to the exemplary embodiment in accordance with FIG. 3, the construction of the SCH quantum well structure 13 according to FIG. 3 is applied on the semiconductor substrate 8 in a reversed order. The hole injection now takes place via the sequence of junction layers 6 and 7 which lie on that side of the active zone 3 which is near the surface, the sequence again being oppositely doped and highly conductive. The construction and the choice of materials for the corresponding layers are otherwise analogous to the exemplary embodiment of FIG. 3.

Heavily n-doped (or $n^+$-doped) and heavily p-doped (or p-doped), that is to say degenerated doping, should in each case be understood to mean a dopant concentration of greater than $10^{17} cm^{-3}$.

Of course the description of the semiconductor component according to the invention using these exemplary embodiments must not be understood as a restriction of the invention to these exemplary embodiments. Laser diodes and light-emitting diodes according to the invention may likewise be constructed on the basis of other semiconductor materials, such as, for example, GaN or related mixed-crystal systems, or II–IV semiconductors such as CdTe, BeTe, BeSe, ZnS, MgS, CdSe, HgTe or related mixed-crystal systems such as $Zn_xCd_{1-x}S_ySe_{1-y}$, $Be_xZn_yCd_{1-x-y}Te$, $Be_xMg_yZn_{1-x-y}Te$, $Be_xMg_yZn_{1-x-y}S$ or $Be_xZn_yCd_{1-x-y}S$. In addition to GaAs, it is also possible to use GaP, ZnSe, Si, Ge, InP, InGaAs, ZnO, $Al_2O_3$, SiC or the like as a substrate.

We claim:

1. An optoelectronic semiconductor component, comprising:
   a semiconductor substrate;
   a contact layer connected to said semiconductor substrate;
   an active zone provided on said semiconductor substrate for generating an electromagnetic radiation in said active zone when a current flows through said active zone;
   a poorly dopable semiconductor layer associated with said active zone; and
   a reverse-biased layer sequence having a heavily p-doped first degenerated junction layer containing BeTe and having a heavily n-doped second degenerated junction layer, said reverse-biased layer sequence serving as an electrical charge carrier source and being disposed between said poorly dopable semiconductor layer and said contact layer, and said heavily p-doped first degenerated junction layer disposed between said poorly dopable semiconductor layer and said heavily n-doped second degenerated junction layer.

2. The optoelectronic semiconductor component according to claim 1, wherein said poorly dopable semiconductor layer is a p-doped II–VI semiconductor layer containing ZnSe.

3. The optoelectronic semiconductor component according to claim 2, wherein said p-doped II–VI semiconductor layer includes a ZnMgSSe-containing II–VI semiconductor layer.

4. The optoelectronic semiconductor component according to claim 2, wherein said p-doped II–VI semiconductor layer includes a BeMgZnSe containing II–VI semiconductor layer.

5. The optoelectronic semiconductor component according to claim 1, wherein said heavily p-doped first degenerated junction layer contains BeMgZnTe.

6. The optoelectronic semiconductor component according to claim 1, wherein said heavily p-doped first degenerated junction layer contains BeZnCdTe.

7. The optoelectronic semiconductor component according to claim 1, including a first waveguide layer and a second waveguide layer, said active zone having a quantum well structure disposed between said first waveguide layer and said second waveguide layer.

8. The optoelectronic semiconductor component according to claim 7, including a first outer cladding layer and a second outer cladding layer, said active zone and said first and second waveguide layers being provided between said first outer cladding layer and said second outer cladding layer.

9. The optoelectronic semiconductor component according to claim 8, wherein said second outer cladding layer is n-conducting, said first outer cladding layer including said poorly dopable semiconductor layer, said first degenerated junction layer and said second degenerated junction layer is disposed between said second outer cladding layer and said contact layer.

10. The optoelectronic semiconductor component according to claim 8, wherein said first outer cladding layer and said second outer cladding layer are n-conducting, said poorly dopable semiconductor layer, said first degenerated junction layer, and said second degenerated junction layer are disposed between one of said first and second waveguide layers and one of said first and second outer cladding layers provided downstream of said one of said first and second waveguide layers as seen from said active zone.

11. The optoelectronic semiconductor component according to claim 8, wherein said first outer cladding layer and said second outer cladding layer are n-conducting, said first degenerated junction layer is provided on one of said first and second waveguide layers and said second degenerated junction layer is provided on said first degenerated junction layer, one of said first and second outer cladding layers is provided downstream of said second degenerated junction layer, as seen from said active zone.

12. The optoelectronic semiconductor component according to claim 1, wherein said active zone includes semiconductor material selected from the group consisting of beryllium-containing chalcogenides and $Zn_{1-x}Cd_xS_ySe_{1-y}$.

13. The optoelectronic semiconductor component according to claim 7, wherein said first waveguide layer and said second waveguide layer include semiconductor material selected from the group consisting of beryllium-containing chalcogenides.

14. The optoelectronic semiconductor component according to claim 8, wherein said first outer cladding layer and said second outer cladding layer include semiconductor material selected from the group consisting of beryllium-containing chalcogenides.

15. The optoelectronic semiconductor component according to claim 1, wherein said first degenerated junction layer is doped with a dopant selected from the group consisting of As, Sb, P, K, Rb, Cs, C, Si, Ge, and Sn.

16. The optoelectronic semiconductor component according to claim 8, wherein said first and said second outer cladding layers each have a thickness of at least 200 nm and are spaced apart by a distance between approximately 100 nm and approximately 400 nm.

* * * * *